(12) United States Patent
Lo et al.

(10) Patent No.: US 10,998,016 B2
(45) Date of Patent: May 4, 2021

(54) MEMORY DEVICE INCLUDING NOISE-SUPPRESSING MECHANISM

(71) Applicant: Realtek Semiconductor Corporation, Hsinchu (TW)

(72) Inventors: Chin-Yuan Lo, Hsinchu (TW); Ting-Ying Wu, Hsinchu County (TW); Hsin-Hui Lo, Miaoli County (TW); Nan-Chin Chuang, Taipei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/556,381

(22) Filed: Aug. 30, 2019

(65) Prior Publication Data

US 2020/0075066 A1  Mar. 5, 2020

(30) Foreign Application Priority Data

Sep. 3, 2018 (TW) ................................ 107130872

(51) Int. Cl.
*G11C 8/16* (2006.01)
*G11C 7/10* (2006.01)
*G11C 11/4074* (2006.01)

(52) U.S. Cl.
CPC ........ *G11C 7/1072* (2013.01); *G11C 11/4074* (2013.01)

(58) Field of Classification Search
CPC ....... G11C 5/147; G11C 16/30; G11C 13/003; G11C 5/14; G11C 5/06; G11C 8/08
See application file for complete search history.

(56) References Cited

U.S. PATENT DOCUMENTS

| | | | | |
|---|---|---|---|---|
| 5,798,961 | A * | 8/1998 | Heyden | H02J 9/061 365/212 |
| 6,331,787 | B1 * | 12/2001 | Whitworth | H04L 25/0278 326/30 |
| 8,897,091 | B1 * | 11/2014 | Burstein | G11C 29/028 365/226 |
| 2002/0105837 | A1 * | 8/2002 | Kim | G11C 5/02 365/189.09 |
| 2003/0137860 | A1 * | 7/2003 | Khatri | G11C 7/1048 365/63 |

(Continued)

FOREIGN PATENT DOCUMENTS

| TW | 200937444 A | 9/2009 |
|---|---|---|
| TW | 201730570 A | 9/2017 |
| TW | 201826133 A | 7/2018 |

*Primary Examiner* — Tuan T Nguyen
(74) *Attorney, Agent, or Firm* — Locke Lord LLP; Tim Tingkang Xia, Esq.

(57) ABSTRACT

A memory device that includes a driver IC, a voltage-dividing resistor, at least two noise-suppressing resistors and at least three memory ICs is provided. A terminal of the voltage-dividing resistor is electrically coupled to a voltage source and another other terminal of the voltage-dividing resistor is electrically coupled to the driver IC through an end a connection path. One of the memory ICs is electrically coupled to the voltage-dividing resistor and the driver IC through the end the connection path. Each of at least two of the other memory ICs is electrically coupled to the connection path through one of the noise-suppressing resistors and is further electrically coupled to the driver IC.

9 Claims, 2 Drawing Sheets

(56) References Cited

U.S. PATENT DOCUMENTS

| | | | | |
|---|---|---|---|---|
| 2003/0161196 A1* | 8/2003 | Park | ............... | G11C 5/063 |
| | | | | 365/200 |
| 2006/0285389 A1* | 12/2006 | Cho | ............... | G11C 8/08 |
| | | | | 365/185.18 |
| 2012/0155168 A1* | 6/2012 | Kim | ............... | G11C 11/5628 |
| | | | | 365/185.03 |
| 2013/0088258 A1* | 4/2013 | Yokou | ............... | G11C 11/4093 |
| | | | | 326/30 |
| 2014/0104931 A1* | 4/2014 | Katoh | ............... | G11C 13/0069 |
| | | | | 365/148 |
| 2018/0268878 A1* | 9/2018 | Ogiwara | ............... | G11C 7/062 |
| 2019/0379299 A1* | 12/2019 | Imura | ............... | H02M 1/32 |
| 2020/0036285 A1* | 1/2020 | Ozoe | ............... | G11C 16/08 |
| 2020/0098427 A1* | 3/2020 | Lee | ............... | G11C 13/0004 |

* cited by examiner

MEMORY DEVICE INCLUDING NOISE-SUPPRESSING MECHANISM

RELATED APPLICATIONS

This application claims priority to Taiwan Application Serial Number 107130872, filed Sep. 3, 2018, which is herein incorporated by reference.

BACKGROUND

Field of Invention

The present invention relates to a memory technology. More particularly, the present invention relates to a memory device.

Description of Related Art

Electronic apparatus usually includes memory devices such that the data can be stored therein or can be accessed therefrom. Under the condition that more amounts of data are required to be accessed, the data transmission speed of the memory devices in the electronic apparatus is requested to be higher. However, when the data transmission speed can not be further increased, increasing the amounts of data transmission becomes challenging.

Accordingly, what is needed is a memory device to address the issues mentioned above.

SUMMARY

An aspect of the present invention is to provide a memory device that includes a driver integrated circuit (IC), a voltage-dividing resistor, at least two noise-suppressing resistors and at least three memory integrated circuits (ICs) is provided. One terminal of the voltage-dividing resistor is electrically coupled to a voltage source and another terminal of the voltage-dividing resistor is electrically coupled to the driver IC through an end terminal of a connection path. One of the memory ICs is electrically coupled to the voltage-dividing resistor and the driver IC through the end terminal of the connection path, and each of the at least two of the other memory ICs is electrically coupled to the connection path through one of the noise-suppressing resistors to be further electrically coupled to the driver IC.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
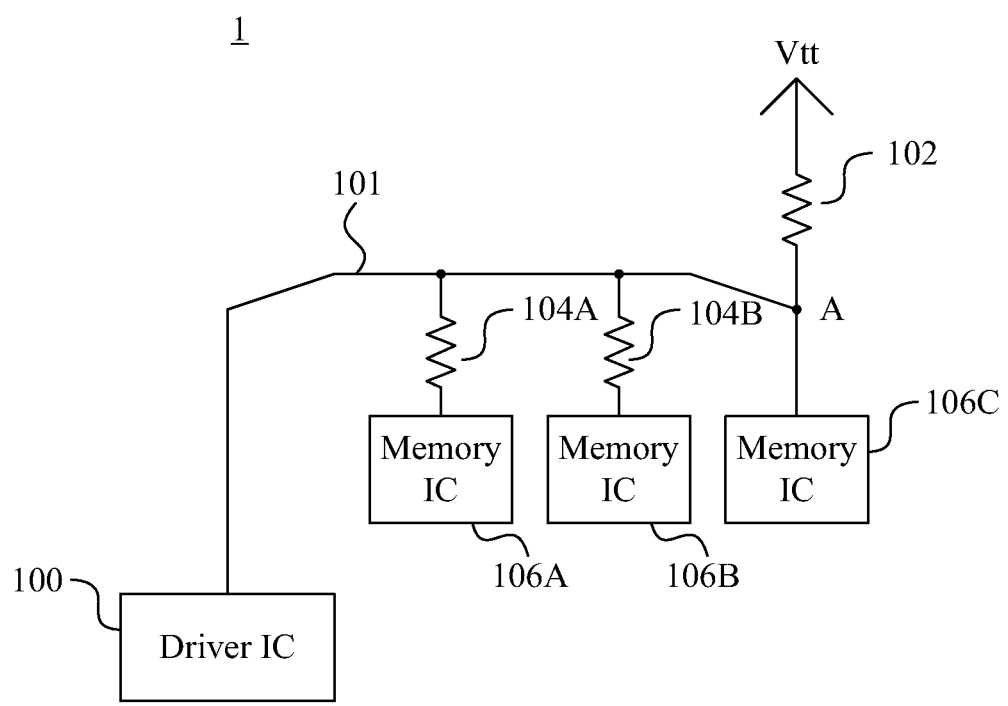
FIG. 1 is a block diagram of a memory device in an embodiment of the present invention.

Reference is now made to FIG. 1. FIG. 1 is a block diagram of a memory device 1 in an embodiment of the present invention. The memory device 1 includes a driver integrated circuit (IC) 100, a voltage-dividing resistor 102, noise-suppressing resistors 104A-104B and memory integrated circuits (ICs) 106A-106C.

In an embodiment, the driver IC 100 is a system on a chip (SoC) and is configured to drive the memory ICs 106A-106C through a connection path 101 to perform data access on the memory ICs 106A-106C. In different embodiments, the connection path 101 can be various kinds of buses that can transmit signals.

One terminal of the voltage-dividing resistor 102 is electrically coupled to a voltage source Vtt and another terminal of the voltage-dividing resistor 102 is electrically coupled to the driver IC 100 through an end terminal A of the connection path 101.

In an embodiment, each of the memory ICs 106A-106C is a double data rate synchronous dynamic random access memory (DDR SDRAM).

The memory unit 106C is electrically coupled to the voltage-dividing resistor 102 and the driver IC 100 through the end terminal A of the connection path 101. The memory ICs 106A and 106B are electrically coupled to the connection path 101 respectively through the noise-suppressing resistors 104A and 104B to be further electrically coupled to the driver IC 100.

As a result, the driver IC 100 can transmit signals through the connection path 101 to the memory ICs 106A-106C, drive and control the memory ICs 106A-106C and further access the data in the memory ICs 106A-106C.

In an embodiment, when the driver IC 100 transmits signals to the memory ICs 106A-106C, reflection and resonance of the signals easily occur among the memory ICs 106A-106C such that the memory ICs 106A-106C can not operate normally. However, by disposing the voltage-dividing resistor 102, the reflection of the signals at the end terminal A can be greatly reduced. The noise-suppressing resistors 104A-104B also effectively suppress the reflection of the signals from the memory ICs 106A and 106B or the signals transmitted to other memory ICs reflected to the memory ICs 106A and 106B.

In an embodiment, the noise-suppressing resistors 104A and 104B have different resistances. In another embodiment, the noise-suppressing resistors 104A and 104B have the same resistance.

Figure 2A:
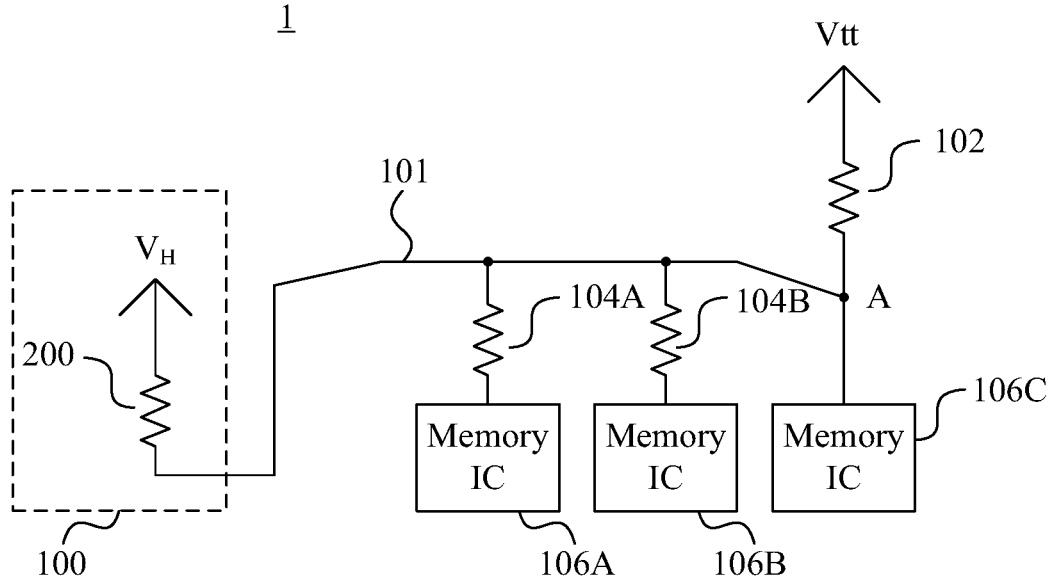
FIG. 2A is a more detailed diagram of the memory device in an embodiment of the present invention.

Reference is now made to FIG. 2A. FIG. 2A is a more detailed diagram of the memory device 1 in an embodiment of the present invention.

In an embodiment, the driver IC 100 includes a high voltage terminal VH electrically coupled to the connection path 101 through a high voltage resistor 200. A high voltage level received by each of the memory ICs 106A-106C is determined based on a voltage which is a voltage difference between the high voltage terminal VH and the voltage source Vtt further divided according to the high voltage resistor 200 and the voltage-dividing resistor 102.

For example, in an embodiment, the voltage at the high voltage terminal VH is 1.2 volts. The voltage of the voltage source Vtt is 0.6 volts. The resistance of the high voltage resistor 200 is R1 and the resistance of the voltage-dividing resistor 102 is R2. The high voltage level received by each of the memory ICs 106A-106C is $((1.2-0.6) \times R2/(R1+R2)+0.6)$.

In an embodiment, take the memory unit 106A as an example, the resistance of the noise-suppressing resistor 104A affects the width of the positive edge of the signal. In general, when the resistance of the noise-suppressing resistor 104A is larger, the noise-suppressing ability becomes better. However, the large resistance also makes the time that the signal transmits from the low level to the high level becomes longer and makes the width of the positive edge larger.

When the resistance of the noise-suppressing resistor 104A is too larger such that the level of the signal starts to decrease before the high level is reached, the memory unit 106A may not operation normally. As a result, in an embodiment, the resistance of the noise-suppressing resistor 104A should be as large as possible while still makes the signal of the memory unit 106A reach the high voltage level before the beginning of the negative edge.

Figure 2B:
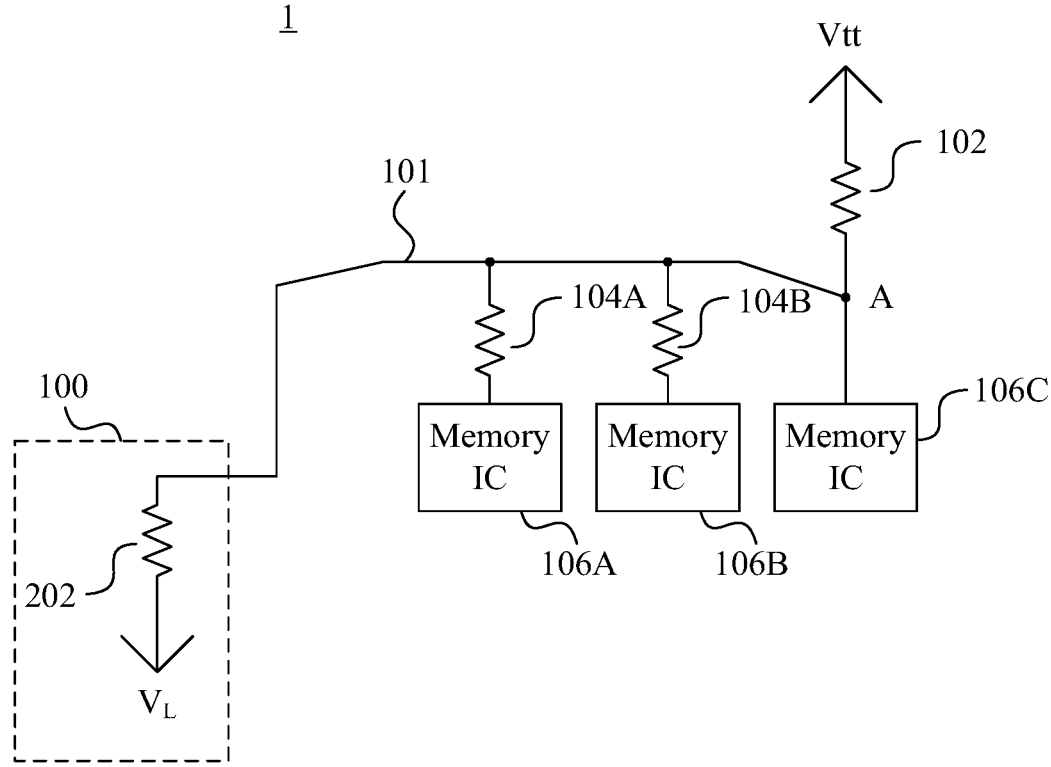
FIG. 2B is a more detailed diagram of the memory device in an embodiment of the present invention.

Reference is now made to FIG. 2B. FIG. 2B is a more detailed diagram of the memory device 1 in an embodiment of the present invention.

In an embodiment, the driver IC 100 includes a low voltage terminal VL electrically coupled to the connection path 101 through a low voltage resistor 202. A low voltage level received by each of the memory ICs 106A-106C is determined based on a voltage which is a voltage difference between the low voltage terminal VL and the voltage source Vtt further divided according to the low voltage resistor 202 and the voltage-dividing resistor 102.

For example, in an embodiment, the voltage at the low voltage terminal VL is 0 volt. The voltage of the voltage source Vtt is 0.6 volts. The resistance of the low voltage resistor 202 is R3 and the resistance of the voltage-dividing resistor 102 is R2. The low voltage level received by each of the memory ICs 106A-106C is $(0.6-0) \times R3/(R3+R2)$.

As a result, the memory device 1 of the present invention dispose a plurality of memory ICs 106A-106C and further disposes the corresponding noise-suppressing resistors 104A-104B to be electrically coupled to the memory ICs and the driver IC 100. The multiple number of the memory ICs 106A-106C increase the amount of the data that can be accessed, and the reflection of the resonance of the signals among the memory ICs 106A-106C can be avoided to make sure the operation of the memory device 1 is normal.

It is appreciated that the memory device 1 that includes three memory ICs 106A-106C described above is merely an example. In other embodiments, the memory device 1 may include more than three memory ICs.

In an embodiment, the memory device 1 is formed on a circuit board (not illustrated) having at least two layers of wires. When the memory devices is formed on the circuit board having two layers of wires, since the two layers of wires include signal lines that refer to the ground lines disposed next to the signal lines, resonance and reflection of the signals easily occur. However, by using the noise-suppressing mechanism provided by the memory device 1, the memory ICs in the memory device 1 can operate normally even under such crucial condition of the circuit board having two layers of wires.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A device comprising:
   a driver integrated circuit (IC);
   a voltage-dividing resistor having one terminal electrically coupled to a voltage source and another terminal electrically coupled to the driver IC through an end terminal of a connection path;
   at least two noise-suppressing resistors; and
   at least three memory integrated circuits (ICs), wherein one of the memory ICs is electrically coupled to the voltage-dividing resistor and the driver IC through the end terminal of the connection path, and each of the at least two of the other memory ICs is electrically coupled to the connection path through a respective one of the noise-suppressing resistors, the connection path being electrically coupled with the driver IC,
   wherein the driver IC comprises a high voltage terminal electrically coupled to the connection path through a high voltage resistor.

2. The device of claim 1, wherein a high voltage level received by each of the memory ICs is determined based on a voltage which is a voltage difference between the high voltage terminal and the voltage source further divided according to the high voltage resistor and the voltage-dividing resistor.

3. The device of claim 2, wherein a resistance of each of the noise-suppressing resistors makes a signal of each of the memory ICs reach the high voltage level before a beginning of a negative edge.

4. The device of claim 1, wherein the driver IC comprises a low voltage terminal electrically coupled to the connection path through a low voltage resistor, and a low voltage level of each of the memory ICs is determined based on a voltage which is a voltage difference between the low voltage terminal and the voltage source further divided according to the low voltage resistor and the voltage-dividing resistor.

5. The device of claim 1, wherein the device is formed on a circuit board having at least two layers of wires.

6. The device of claim 1, wherein the noise-suppressing resistors have the same resistance.

7. The device of claim 1, wherein the noise-suppressing resistors have different resistances.

8. The device of claim 1, wherein the driver IC is a system on a chip (SOC).

9. The device of claim 1, wherein each of the memory ICs is a double data rate synchronous dynamic random access memory (DDR SDRAM).

* * * * *